(12) United States Patent
Yang et al.

(10) Patent No.: US 10,403,536 B2
(45) Date of Patent: Sep. 3, 2019

(54) METHOD OF FIXING SUBSTRATE USING ELECTROSTATIC CHUCK AND SUBSTRATE PROCESSING APPARATUS INCLUDING THE SAME

(71) Applicant: Samsung Display Co., Ltd., Yongin-si, Gyeonggi-do (KR)

(72) Inventors: Su-Kyoung Yang, Yongin-si (KR); Gyung-Min Baek, Yongin-si (KR); Joon-Yong Park, Gunpo-si (KR); Chang-Oh Jeong, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 535 days.

(21) Appl. No.: 15/178,427

(22) Filed: Jun. 9, 2016

(65) Prior Publication Data
US 2017/0098567 A1  Apr. 6, 2017

(30) Foreign Application Priority Data

Oct. 1, 2015 (KR) .................. 10-2015-0138344

(51) Int. Cl.
*H01L 21/683* (2006.01)
*C23C 14/50* (2006.01)
*C23C 16/458* (2006.01)

(52) U.S. Cl.
CPC .......... *H01L 21/6833* (2013.01); *C23C 14/50* (2013.01); *C23C 16/4586* (2013.01)

(58) Field of Classification Search
CPC .. H01L 21/6833; C23C 14/50; C23C 16/4586
See application file for complete search history.

(56) References Cited

U.S. PATENT DOCUMENTS

| | | | | |
|---|---|---|---|---|
| 5,160,152 A | * | 11/1992 | Toraguchi | H01L 21/67103 279/128 |
| 5,315,473 A | * | 5/1994 | Collins | H01L 21/6833 361/233 |
| 5,583,736 A | * | 12/1996 | Anderson | H01L 21/6831 279/128 |
| 5,880,923 A | * | 3/1999 | Hausmann | H01L 21/6833 279/128 |
| 2010/0254065 A1 | * | 10/2010 | Nakamura | H01L 21/6833 361/234 |
| 2011/0083786 A1 | * | 4/2011 | Guo | B32B 37/007 156/64 |

(Continued)

FOREIGN PATENT DOCUMENTS

| | | |
|---|---|---|
| KR | 10-2010-0086790 A | 8/2010 |
| KR | 10-2012-0126354 A | 11/2012 |

*Primary Examiner* — Jeffrie R Lund
(74) *Attorney, Agent, or Firm* — F. Chau & Associates, LLC

(57) ABSTRACT

An electrostatic chuck and a substrate processing apparatus including the same are disclosed. In one aspect, the electrostatic chuck includes a stage configured to support a substrate including a panel formation region and a dummy region surrounding the panel formation region. The electrostatic chuck includes a substrate fixing unit including a plurality of electrode patterns insulated from the substrate and spaced apart from one another, the substrate fixing unit at least partially overlapping the dummy region of the substrate and not overlapping the panel formation region of the substrate.

10 Claims, 13 Drawing Sheets

(56) References Cited

U.S. PATENT DOCUMENTS

| | | | |
|---|---|---|---|
| 2011/0102965 A1* | 5/2011 | Fujisawa | H01L 21/6833 361/234 |
| 2012/0288619 A1* | 11/2012 | Choi | C23C 14/24 427/66 |
| 2013/0070384 A1* | 3/2013 | Cooke | B23Q 3/152 361/234 |
| 2013/0100573 A1* | 4/2013 | Shu | H01L 21/67288 361/234 |
| 2013/0114181 A1* | 5/2013 | Drewery | H01L 21/6833 361/234 |
| 2015/0135514 A1* | 5/2015 | Sasaki | H01L 21/6833 29/559 |
| 2017/0098567 A1* | 4/2017 | Yang | C23C 14/50 |
| 2017/0213753 A1* | 7/2017 | Rogers | H01L 21/6719 |
| 2017/0280509 A1* | 9/2017 | Takebayashi | H01L 21/6833 |

\* cited by examiner

METHOD OF FIXING SUBSTRATE USING ELECTROSTATIC CHUCK AND SUBSTRATE PROCESSING APPARATUS INCLUDING THE SAME

CROSS-REFERENCE TO RELATED APPLICATION

This application claims priority under 35 USC § 119 to Korean Patent Application No. 10-2015-0138344, filed on Oct. 1, 2015 in the Korean Intellectual Property Office (KIPO), the contents of which are herein incorporated by reference in their entirety.

BACKGROUND

Field

The described technology generally relates to an electrostatic chuck and a substrate processing apparatus including the same.

Description of the Related Technology

In the manufacturing process of a display panel such as a liquid crystal display (LCD) device and an organic light-emitting diode (OLED) device (or similarly for a semiconductor), a chuck has been used for fixing a substrate or a wafer to a stage. The chuck includes a mechanical chuck using a vacuum or a clamp and an electric chuck.

The mechanical chuck using the clamp is complicated and requires much time to maintain or repair. It is not easy to control a suction strength of the mechanical chuck using the vacuum. For example, the suction strength of the mechanical chuck using the vacuum is too weak to fix the substrate to the stage or is so strong that the substrate becomes deformed.

SUMMARY OF CERTAIN INVENTIVE ASPECTS

One inventive aspect relates to an electrostatic chuck having a plurality of electrode patterns and a substrate processing apparatus including the same.

Another aspect is an electrostatic chuck that can manufacture a panel having an enhanced display quality.

Another aspect is a substrate processing apparatus that can manufacture a panel having an enhanced display quality.

Another aspect is an electrostatic chuck that includes a stage and a substrate fixing unit. The stage may support a substrate having a panel formation region and a dummy region surrounding the panel formation region. The substrate fixing unit may include a plurality of electrode patterns insulated from the substrate and spaced apart from one another. At least a portion of the substrate fixing unit may overlap the dummy region of the substrate. The substrate fixing unit may not overlap the panel formation region.

In example embodiments, the substrate fixing unit may include first and second fixing portions, each of which extends in a first direction. The first and second fixing portions may be arranged along a second direction crossing the first direction.

In example embodiments, the substrate fixing unit may further include third and fourth fixing portions, each of which extends in the second direction. The third and fourth fixing portions may be arranged along the first direction. The third fixing portion may connect a first end of the first fixing portion with a first end of the second fixing portion. The fourth fixing portion may connect a second end of the first fixing portion with a second end of the second fixing portion.

In example embodiments, the substrate fixing unit may include a plurality of first point fixing portions and a plurality of second point fixing portions. The first point fixing portions may be arranged along a first direction and spaced apart from one another. The second point fixing portions may be arranged along the first direction and spaced apart from one another. The plurality of first point fixing portions and the plurality of second point fixing portions may be arranged along a second direction crossing the first direction.

In example embodiments, the substrate fixing unit may further include a plurality of third point fixing portions and a plurality of fourth point fixing portions. The third point fixing portions may be arranged along the second direction and spaced apart from one another. The fourth point fixing portions may be arranged along the second direction and spaced apart from one another. The plurality of third point fixing portions and the plurality of fourth point fixing portions may be arranged along the first direction.

In example embodiments, each of the first and second point fixing portions may have a polygonal shape In example embodiments, each of the first and second point fixing portions may have a circular shape or an elliptical shape.

In example embodiments, the electrostatic chuck may further include an insulation layer covering surfaces of the electrode patterns and a top surface of the stage. The insulation layer may insulate the electrode patterns from the substrate.

In example embodiments, a width of at least the portion of the substrate fixing unit overlapping the dummy region of the substrate may be within a range from about 1 mm to about 5 mm from an edge portion of the substrate, in a plan view.

In example embodiments, an area of at least the portion of the substrate fixing unit overlapping the dummy region of the substrate may be within a range from 1% of an area of the substrate to 20% of the area of the substrate.

Another aspect is a substrate processing apparatus that includes an electrostatic chuck, a power supply, a substrate processing unit and a chamber. The electrostatic chuck may include a stage and a substrate fixing unit. The stage may supports substrate having a panel formation region and a dummy region surrounding the panel formation region. The substrate fixing unit may include a plurality of electrode patterns insulated from the substrate and spaced apart from one another. At least a portion of the substrate fixing unit may overlap the dummy region of the substrate. The substrate fixing unit may not overlap the panel formation region. The power supply may be electrically connected to the electrode patterns. The substrate processing unit may be arranged on the electrostatic chuck. The substrate processing unit may process the panel formation region of the substrate. The chamber may receive the electrostatic chuck and the substrate processing unit.

In example embodiments, the substrate fixing unit may include first and second fixing portions, each of which extends in a first direction. The first and second fixing portions may be arranged along a second direction crossing the first direction.

In example embodiments, the substrate fixing unit may further include third and fourth fixing portions, each of which extends in the second direction. The third and fourth fixing portions may be arranged along the first direction. The third fixing portion may connect a first end of the first fixing portion with a first end of the second fixing portion. The fourth fixing portion may connect a second end of the first fixing portion with a second end of the second fixing portion.

In example embodiments, the substrate fixing unit may include a plurality of first point fixing portions and a plurality of second point fixing portions. The first point fixing portions may be arranged along a first direction and spaced apart from one another. The second point fixing portions may be arranged along the first direction and spaced apart from one another. The plurality of first point fixing portions and the plurality of second point fixing portions may be arranged along a second direction crossing the first direction.

In example embodiments, the substrate fixing unit may further include a plurality of third point fixing portions and a plurality of fourth point fixing portions. The third point fixing portions may be arranged along the second direction and spaced apart from one another. The fourth point fixing portions may be arranged along the second direction and spaced apart from one another. The plurality of third point fixing portions and the plurality of fourth point fixing portions may be arranged along the first direction.

In example embodiments, each of the first and second point fixing portions may have a polygonal shape In example embodiments, each of the first and second point fixing portions may have a circular shape or an elliptical shape.

In example embodiments, the substrate processing apparatus may further include an insulation layer covering surfaces of the electrode patterns and a top surface of the stage. The insulation layer may insulate the electrode patterns from the substrate.

In example embodiments, a width of at least the portion of the substrate fixing unit overlapping the dummy region of the substrate may be within a range from about 1 mm to about 5 mm from an edge portion of the substrate, in a plan view.

In example embodiments, an area of at least the portion of the substrate fixing unit overlapping the dummy region of the substrate may be within a range from 1% of an area of the substrate to 20% of the area of the substrate.

In the electrostatic chuck in accordance with example embodiments, at least the portion of the substrate fixing unit generating an electrostatic force may overlap the dummy region of the substrate, and the substrate fixing unit may not overlap the panel formation region, of the substrate.

Another aspect is an electrostatic chuck comprising: a stage configured to support a substrate including a panel formation region and a dummy region surrounding the panel formation region; and a substrate fixing unit including a plurality of electrode patterns insulated from the substrate and spaced apart from one another, the substrate fixing unit at least partially overlapping the dummy region of the substrate and not overlapping the panel formation region of the substrate.

In the above electrostatic chuck, the substrate fixing unit includes first and second fixing portions, each of which extends in a first direction, and wherein the first and second fixing portions are arranged along a second direction crossing the first direction. In the above electrostatic chuck, the substrate fixing unit further includes third and fourth fixing portions, each of which extends in the second direction, wherein the third and fourth fixing portions are arranged along the first direction, and wherein the third fixing portion connects a first end of the first fixing portion with a first end of the second fixing portion, and wherein the fourth fixing portion connects a second end of the first fixing portion with a second end of the second fixing portion.

In the above electrostatic chuck, the substrate fixing unit further includes a plurality of first point fixing portions and a plurality of second point fixing portions, wherein the first point fixing portions are arranged along a first direction and spaced apart from one another, and wherein the second point fixing portions are arranged along the first direction and spaced apart from one another, and wherein the first and second point fixing portions are arranged along a second direction crossing the first direction. In the above electrostatic chuck, the substrate fixing unit further includes a plurality of third point fixing portions and a plurality of fourth point fixing portions, wherein the third point fixing portions are arranged along the second direction and spaced apart from one another, and wherein the fourth point fixing portions are arranged along the second direction and spaced apart from one another, and wherein the third and fourth point fixing portions are arranged along the first direction.

In the above electrostatic chuck, each of the first and second point fixing portions has a polygonal shape. In the above electrostatic chuck, each of the first and second point fixing portions has a circular shape or an elliptical shape. The above electrostatic chuck further comprises: an insulation layer covering surfaces of the electrode patterns and a top surface of the stage, the insulation layer insulating the electrode patterns from the substrate. The electrostatic chuck of claim 1, wherein the width of a portion of the substrate fixing unit overlapping the dummy region of the substrate is in the range from about 1 mm to about 5 mm in a plan view. In the above electrostatic chuck, the area of a portion of the substrate fixing unit overlapping the dummy region of the substrate is in the range from about 1% of an area of the substrate to about 20% of the area of the substrate.

Another aspect is a substrate processing apparatus comprising: an electrostatic chuck including a stage and a substrate fixing unit, the stage supporting a substrate having a panel formation region and a dummy region surrounding the panel formation region, the substrate fixing unit including a plurality of electrode patterns insulated from the substrate and spaced apart from one another, the substrate fixing unit at least partially overlapping the dummy region of the substrate and not overlapping the panel formation region; a power supply electrically connected to the electrode patterns; a substrate processing unit arranged on the electrostatic chuck, the substrate processing unit configured to process the panel formation region of the substrate; and a chamber configured to receive the electrostatic chuck and the substrate processing unit.

In the above electrostatic chuck, the substrate fixing unit further includes first and second fixing portions, each of which extends in a first direction, and wherein the first and second fixing portions are arranged along a second direction crossing the first direction. In the above electrostatic chuck, the substrate fixing unit further includes third and fourth fixing portions, each of which extents in the second direction, wherein the third and fourth fixing portions are arranged along the first direction, and wherein the third fixing portion connects a first end of the first fixing portion with a first end of the second fixing portion, and wherein the fourth fixing portion connects a second end of the first fixing portion with a second end of the second fixing portion.

In the above electrostatic chuck, the substrate fixing unit includes a plurality of first point fixing portions and a plurality of second point fixing portions, wherein the first point fixing portions are arranged along a first direction and spaced apart from one another, and wherein the second point fixing portions are arranged along the first direction and spaced apart from one another, and wherein the first and second point fixing portions are arranged along a second direction crossing the first direction.

In the above electrostatic chuck, the substrate fixing unit further includes a plurality of third point fixing portions and a plurality of fourth point fixing portions, wherein the third point fixing portions are arranged along the second direction and spaced apart from one another, and wherein the fourth point fixing portions are arranged along the second direction and spaced apart from one another, and wherein the third and fourth point fixing portions are arranged along the first direction. In the above electrostatic chuck, each of the first and second point fixing portions has a polygonal shape.

In the above electrostatic chuck, each of the first and second point fixing portions has a circular shape or an elliptical shape. In the above electrostatic chuck, the electrostatic chuck further includes an insulation layer covering surfaces of the electrode patterns and a top surface of the stage, and wherein the insulation layer insulates the electrode patterns from the substrate. In the above electrostatic chuck, the width of a portion of the substrate fixing unit overlapping the dummy region of the substrate is in the range from about 1 mm to about 5 mm in a plan view. In the above electrostatic chuck, the area of a portion of the substrate fixing unit overlapping the dummy region of the substrate is in the range from 1% of an area of the substrate to 20% of the area of the substrate.

According to at least one of the disclosed embodiments, a generated electric field to process the panel formation region of the substrate may not be distorted, and a generated spot may be reduced. In addition, a display quality manufactured by the electrostatic chuck may be enhanced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF CERTAIN INVENTIVE EMBODIMENTS

Figure 1:
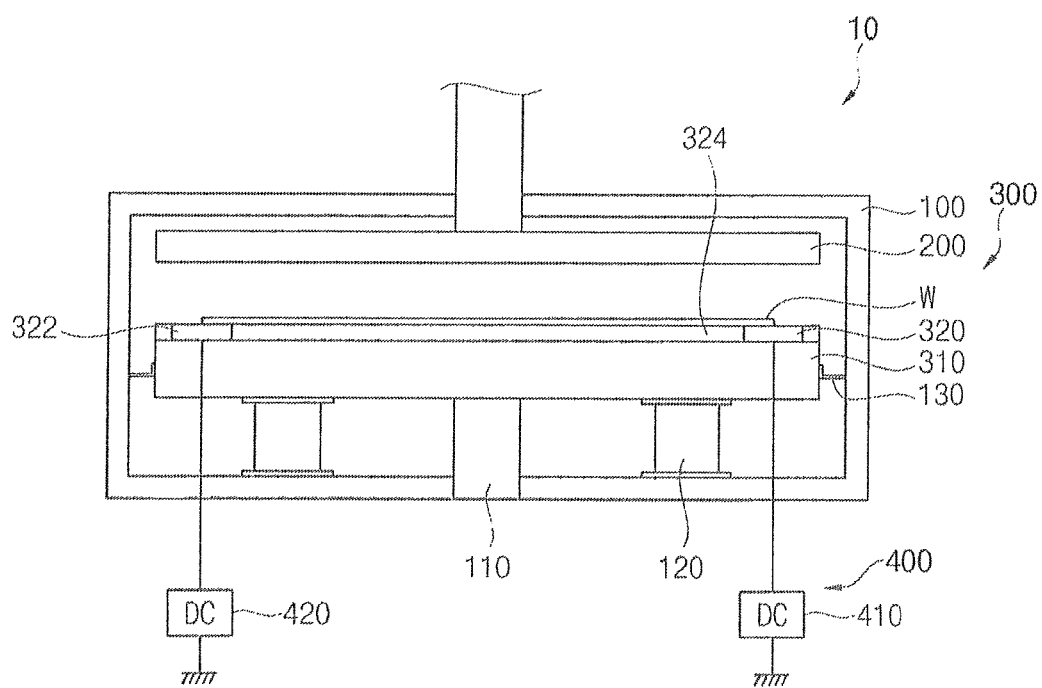
FIG. 1 is a cross-sectional view illustrating a substrate processing apparatus according to example embodiments.

An electrostatic chuck is a kind of electric chuck that is widely used in the manufacture of display panels. The chuck can fix the substrate to the stage by using an electrostatic force such that the chuck structure is simple and the adhesive force is strong. However, an electric field is distorted by the electrostatic force. A spot(s) can result on the pixels generated by machinery, and thus display quality and product yield decrease.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application. In this disclosure, the term "substantially" includes the meanings of completely, almost completely or to any significant degree under some applications and in accordance with those skilled in the art. Moreover, "formed, disposed over positioned over" can also mean "formed, disposed or positioned on." The term "connected" includes an electrical connection.

Figure 2:
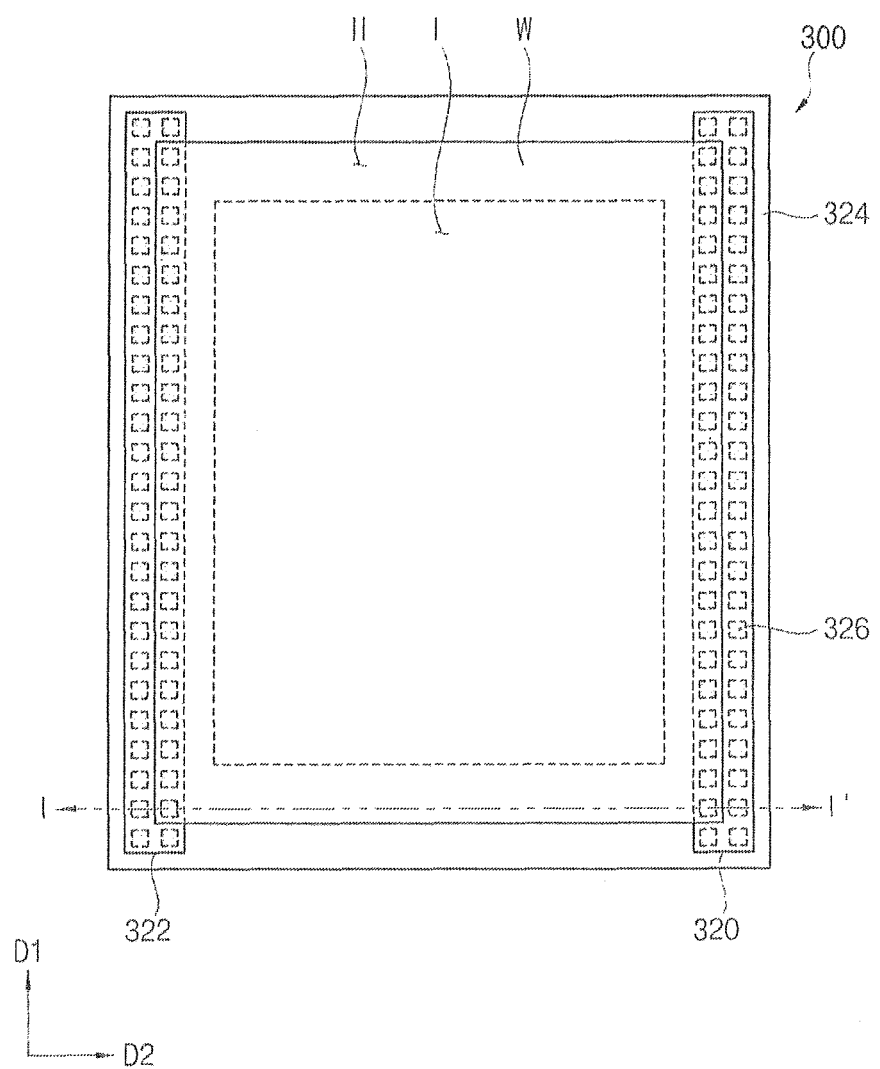
FIG. 2 is a plan view illustrating the electrostatic chuck of the FIG. 1.
Figure 3:
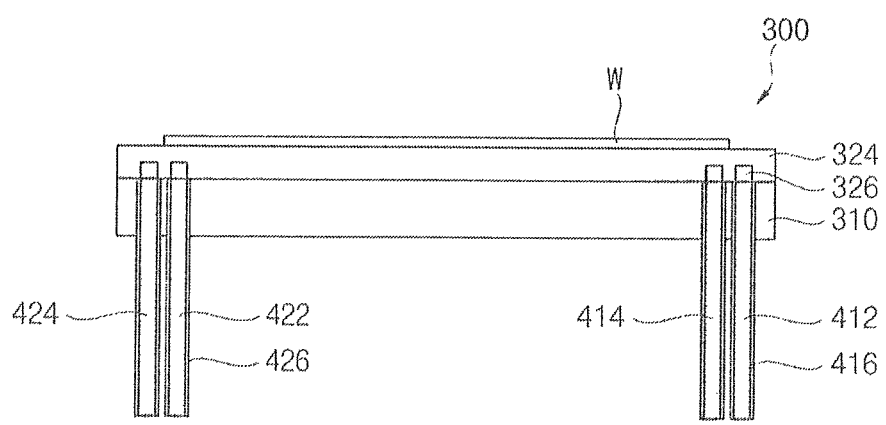
FIG. 3 is a cross-sectional view cut along the line I-I' of the FIG. 2.

FIG. 1 is a cross-sectional view illustrating a substrate processing apparatus 10 according to example embodiments. FIG. 2 is a plan view illustrating the electrostatic chuck of the FIG. 1. FIG. 3 is a cross-sectional view cut along the line I-I' of the FIG. 2.

Referring to FIGS. 1 to 3, the substrate processing apparatus 10 includes a chamber 100, a substrate processing unit 200, an electrostatic chuck 300 and a power supply 400.

A substrate W may include a panel formation region I and a dummy region II surrounding the panel formation region I. In the panel formation region of the substrate W, a plurality of preliminary display panels (not shown) may be formed, and the substrate W may be diced to transform the preliminary display panels to a plurality of display panels by a sawing process.

The chamber 100 may receive the substrate W, the substrate processing unit 200 and the electrostatic chuck 300. An inner space of the chamber 100 to process the substrate W may be in a vacuum state.

The chamber 100 may include support members 110, 120 and 130 to support the electrostatic chuck 300.

The substrate processing unit 200 may process the panel formation region I of the substrate W. For example, the substrate processing unit 200 is a sputter for a sputtering process. Alternatively, the substrate processing unit 200 may be an evaporator for a chemical vapor deposition. The substrate processing unit 200 may be an ion beam implanter.

The substrate processing unit 200 may be disposed over the electrostatic chuck 300 to process the panel formation region I of the substrate W.

The electrostatic chuck 300 may include a stage 310 to support the substrate W and a substrate fixing unit including a plurality of electrode patterns 326.

The stage 310 may support the substrate W in a manufacturing process to the substrate W.

The substrate fixing unit may include the electrode patterns 326 insulated from the substrate W and spaced apart from one another on the stage 310. At least of the substrate fixing unit may overlap the dummy region II of the substrate W, and the substrate fixing unit may not overlap the panel formation region I of the substrate W.

Each of the electrode patterns 326 may be electrically connected to an anode or a cathode of the power supply 400.

Each of two electrode patterns 326 adjacent to each other may electrically connected to a respective one of the anode and the cathode of the power supply 400 such that an electrostatic force between the two electrode patterns 326 is generated to fix the substrate W to the stage 310.

For example, the two electrode patterns 326 may be spaced apart from each other by about 1 mm. In addition, the width of each of the electrode patterns 326 may be about 1 mm.

In example embodiments, the substrate fixing unit may further include an insulation layer 324 which covers surfaces of the electrode patterns 326 and a top surface of the stage 310 and insulates the electrode patterns 326 from the substrate W.

The substrate fixing unit may further include a first fixing portion 320 which fixes a right portion of the dummy region II of the substrate W to the stage 310 and a second fixing portion 322 which fixes a left portion of the dummy region II of the substrate W to the stage 310.

Each of the first and second fixing portions 320 and 322 may extend in a first direction D1. The first and second fixing portions 320 and 322 may be arranged along a second direction D2 crossing the first direction D1.

In example embodiments, the substrate fixing unit may further include a plurality of first wires 412 and 414 and a plurality of second wires 422 and 424 which connect the power supply 400 with the electrode patterns 326 (see FIG. 3).

The power supply 400 may include a first power supply 410 and a second power supply 420. Each of an anode and a cathode of the first power supply 410 may be electrically connected to a respective one of the electrode patterns 326 through a respective one of the first wires 412 and 414, and each of an anode and a cathode of the second power supply 420 may be electrically connected to a respective one of the electrode patterns 326 through a respective one of the second wires 422 and 424.

A first insulation layer 416 may be provided to cover the first wires 412 and 414 and to insulate the first wires 412 and 414 from the stage 310. In addition, a second insulation layer 426 may be provided to cover the second wires 422 and 424 and to insulate the second wires 422 and 424 from the stage 310.

In example embodiments, the width of at least the portion of the substrate fixing unit overlapping the dummy region II of the substrate W is in the range from about 1 mm to about 5 mm from an edge portion of the substrate W, in a plan view.

When the width of at least the portion of the substrate fixing unit is less than about 1 mm, an adhesion force by the substrate fixing unit is so weak to fix the substrate W to the stage 310. When the width of at least the portion of the substrate fixing unit is greater than about 5 mm, the electrostatic force of the electrostatic chuck 300 may distort an electric field for a process to form a display panel. The above range can provide an optimum balance between the adhesion force and the electrostatic force. However, depending on the embodiment, the width of the overlapping portion of the substrate fixing unit can be less than about 1 mm or greater than about 5 mm.

In example embodiments, the area of at least the portion of the substrate fixing unit overlapping the dummy region II of the substrate W is in the range from about 1% of an area of the substrate W to about 20% of the area of the substrate W.

When the area of at least the portion of the substrate fixing unit is less than about 1% of the area of the substrate W, the adhesion force is so weak to fix the substrate W to the stage 310. When the area of at least the portion of the substrate fixing unit is greater than about 20% of the area of the substrate W, the electrostatic force of the electrostatic chuck 300 may distort the electric field for a process to form a display panel. The above range can provide an optimum balance between the adhesion force and the electrostatic force. However, depending on the embodiment, the area of the overlapping portion of the substrate fixing unit can be less than about 1% of the area of the substrate W or greater than about 20% of the area of the substrate W.

In the electrostatic chuck in accordance with example embodiments, at least the portion of the substrate fixing unit generating an electrostatic force may overlap the dummy region II of the substrate W, and the substrate fixing unit may not overlap the panel formation region I of the substrate W.

Accordingly, a generated electric field to process the panel formation region I of the substrate W may not be distorted, and a generated spot may be reduced. In addition, a display quality manufactured by the electrostatic chuck 300 may be enhanced.

Figure 4:
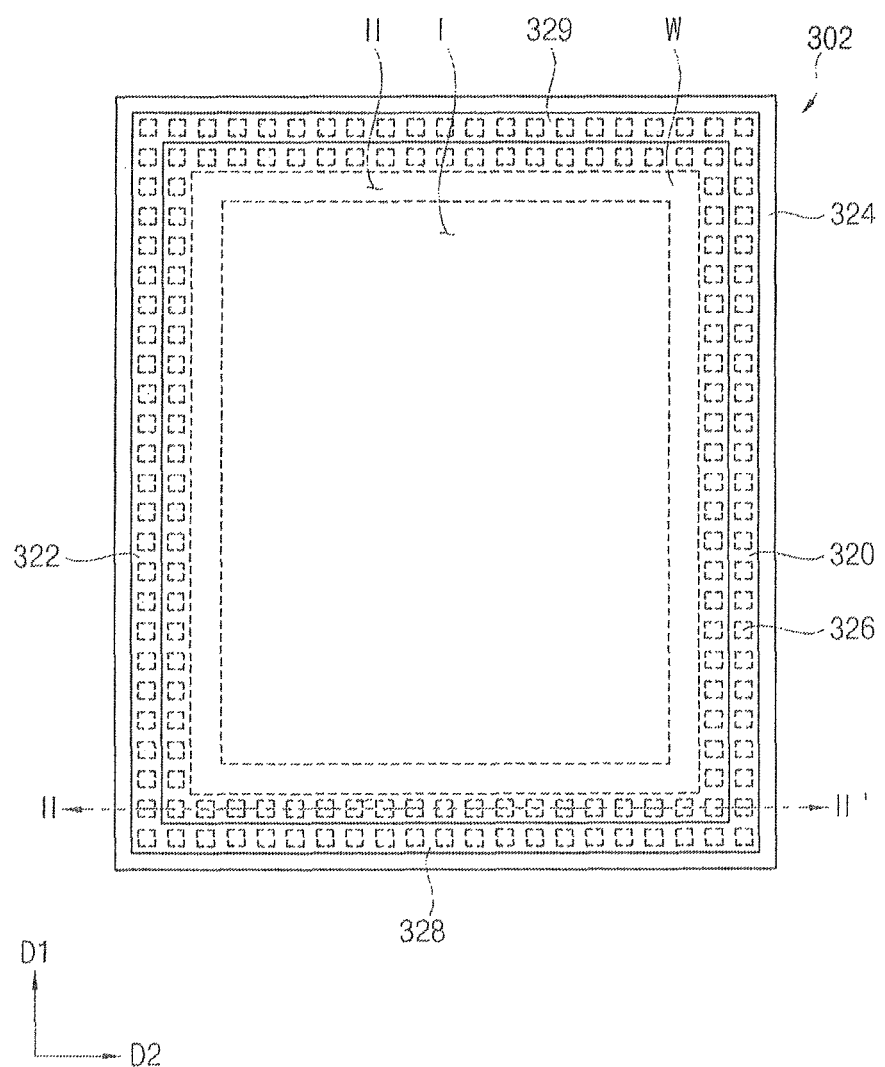
FIG. 4 is a plan view illustrating an electrostatic chuck according to example embodiments.
Figure 5:
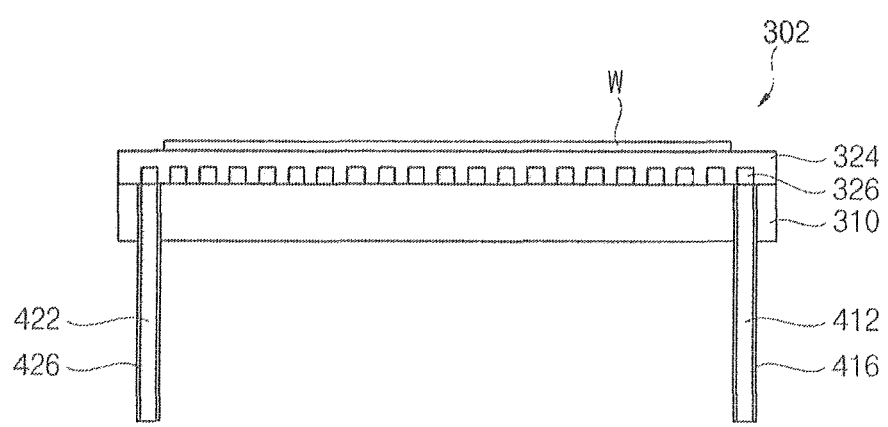
FIG. 5 is a cross-sectional view cut along the line II-II' of the FIG. 4.

FIG. 4 is a plan view illustrating an electrostatic chuck according to example embodiments. FIG. 5 is a cross-sectional view cut along the line II-II' of the FIG. 4. The electrostatic chuck of FIGS. 4 and 5 may be substantially the same as that of FIGS. 1 to 3, except for third and fourth fixing portions. Thus like reference numerals refer to like elements, and repetitive explanations thereon may be omitted herein.

Referring to FIGS. 1, 4 and 5, the substrate processing apparatus 10 includes a chamber 100, a substrate processing unit 200, an electrostatic chuck 302 and a power supply 400.

The electrostatic chuck 302 may include a stage 310 to support the substrate W and a substrate fixing unit including a plurality of electrode patterns 326.

The stage 310 may support the substrate W in a manufacturing process to the substrate W.

The substrate fixing unit may include the electrode patterns 326 insulated from the substrate W and spaced apart from one another on the stage 310. At least of the substrate fixing unit may overlap the dummy region II of the substrate W, and the substrate fixing unit may not overlap the panel formation region I of the substrate W.

Each of the electrode patterns 326 may be electrically connected to an anode or a cathode of the power supply 400.

Each of two electrode patterns 326 adjacent to each other may electrically connected to a respective one of the anode and the cathode of the power supply 400 such that an electrostatic force between the two electrode patterns 326 is generated to fix the substrate W to the stage 310.

The two electrode patterns 326 may be spaced apart from each other by about 1 mm. In addition, a width of each of the electrode patterns 326 may be about 1 mm.

In example embodiments, the substrate fixing unit further includes an insulation layer 324 which covers surfaces of the electrode patterns 326 and a top surface of the stage 310 and insulates the electrode patterns 326 from the substrate W.

The substrate fixing unit may further include a first fixing portion 320 which fixes a right portion of the dummy region II of the substrate W to the stage 310 and a second fixing portion 322 which fixes a left portion of the dummy region II of the substrate W to the stage 310.

Each of the first and second fixing portions 320 and 322 may extend in a first direction D1. The first and second fixing portions 320 and 322 may be arranged along a second direction D2 crossing the first direction D1.

The substrate fixing unit may further include a third fixing portion 328 which fixes an upper portion of the dummy region II of the substrate W to the stage 310 and a fourth fixing portions 329 which fixes a bottom portion of the dummy region II of the substrate W to the stage 310.

Each of the third and fourth fixing portions 328 and 329 may extend in the second direction D2. In addition, the third and fourth fixing portions 328 and 329 may be arranged along the first direction.

The third fixing portions 328 may connect a first end of the first fixing portion 320 with a first end of the second fixing portion 322, and the fourth fixing portions 329 may connect a second end of the first fixing portions 320 with a second end of the second fixing portions 322.

In example embodiments, the substrate fixing unit further includes a plurality of first wires 412 and a plurality of second wires 422 which connect the power supply 400 with the electrode patterns 326.

The power supply 400 includes a first power supply 410 and a second power supply 420. Each of an anode and a cathode of the first power supply 410 may be electrically connected to a respective one of the electrode patterns 326 through a respective one of the first wires 412, and each of an anode and a cathode of the second power supply 420 may be electrically connected to a respective one of the electrode patterns 326 through a respective one of the second wires 422.

A first insulation layer 416 may be provided to cover the first wires 412 and to insulate the first wires 412 from the stage 310. In addition, a second insulation layer 426 may be provided to cover the second wires 422 and to insulate the second wires 422 from the stage 310.

In the electrostatic chuck in accordance with example embodiments, at least the portion of the substrate fixing unit generating an electrostatic force may overlap the dummy region II of the substrate W, and the substrate fixing unit may not overlap the panel formation region I of the substrate W.

Accordingly, a generated electric field to process the panel formation region I of the substrate W may not be distorted, and a generated spot may be reduced. In addition, a display quality manufactured by the electrostatic chuck 302 may be enhanced.

The electrostatic chuck 302 may fix the upper and bottom portions of the dummy region II of the substrate W as well as the right and left portions of the dummy region II of the substrate W such that the substrate W is fixed to the stage 310 with a stronger adhesion force.

Figure 6:
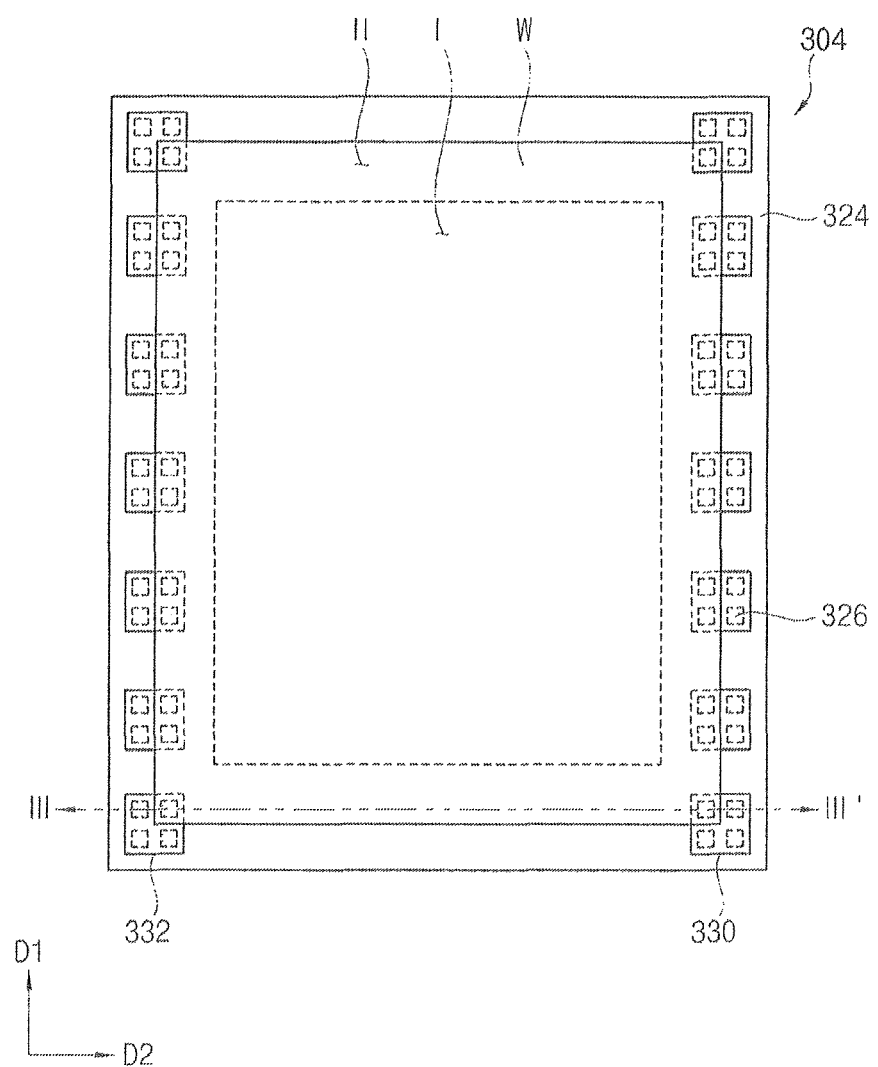
FIG. 6 is a plan view illustrating an electrostatic chuck according to example embodiments.
Figure 7:
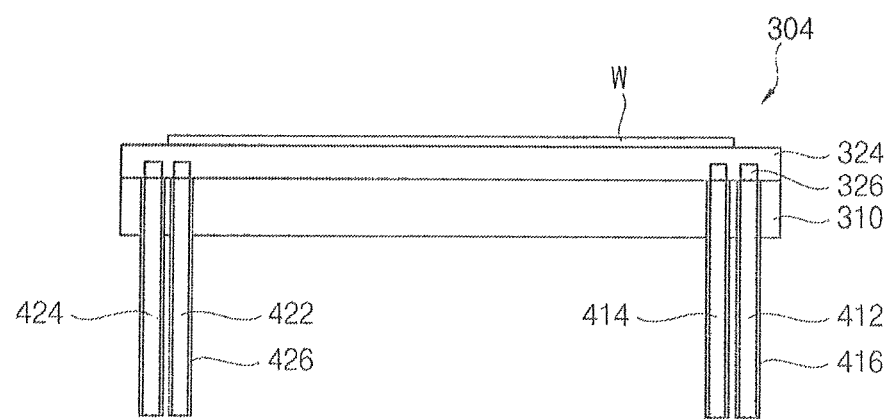
FIG. 7 is a cross-sectional view cut along the line III-III' of the FIG. 6.

FIG. 6 is a plan view illustrating an electrostatic chuck according to example embodiments. FIG. 7 is a cross-sectional view cut along the line III-III' of the FIG. 6. The electrostatic chuck of FIGS. 6 and 7 may be substantially the same as that of FIGS. 1 to 3, except for first and second fixing portions. Thus like reference numerals refer to like elements, and repetitive explanations thereon may be omitted herein.

Referring to FIGS. 1, 6 and 7, the substrate processing apparatus includes a chamber 100, a substrate processing unit 200, an electrostatic chuck 304 and a power supply 400.

The electrostatic chuck 304 may include a stage 310 to support the substrate W and a substrate fixing unit including a plurality of electrode patterns 326.

The stage 310 may support the substrate W in a manufacturing process to the substrate W.

The substrate fixing unit may include the electrode patterns 326 insulated from the substrate W and spaced apart from one another on the stage 310. At least of the substrate fixing unit may overlap the dummy region II of the substrate W, and the substrate fixing unit may not overlap the panel formation region I of the substrate W.

Each of the electrode patterns 326 may be electrically connected to an anode or a cathode of the power supply 400.

Each of two electrode patterns 326 adjacent to each other may electrically connected to a respective one of the anode and the cathode of the power supply 400 such that an electrostatic force between the two electrode patterns 326 is generated to fix the substrate W to the stage 310.

In example embodiments, the substrate fixing unit further includes an insulation layer 324 which covers surfaces of the electrode patterns 326 and a top surface of the stage 310 and insulates the electrode patterns 326 from the substrate W.

The substrate fixing unit may further include a plurality of first point fixing portions 330 each of which fixes a right portion of the dummy region II of the substrate W to the stage 310 and a plurality of second point fixing portions 332 each of which fixes a left portion of the dummy region II of the substrate W to the stage 310.

Each of the first point fixing portions 330 may be arranged along a first direction D1 and may be spaced apart from one another. Each of the second point fixing portions 332 may be arranged along the first direction D1. The plurality of the first point fixing portions 330 and the plurality of the second point fixing portions 332 may be arranged along a second direction crossing the first direction D1.

Each of the first and second point fixing portions 330 and 332 may have a rectangular shape.

In example embodiments, the substrate fixing unit may further include a plurality of first wires 412 and 414 and a plurality of second wires 422 and 424 which connect the power supply 400 with the electrode patterns 326.

Each of an anode and a cathode of the first power supply 410 may be electrically connected to a respective one of the electrode patterns 326 through a respective one of the first wires 412 and 414, and each of an anode and a cathode of the second power supply 420 may be electrically connected to a respective one of the electrode patterns 326 through a respective one of the second wires 422 and 424.

A first insulation layer 416 may be provided to cover the first wires 412 and 414 and to insulate the first wires 412 and 414 from the stage 310. In addition, a second insulation layer 426 may be provided to cover the second wires 422 and 424 and to insulate the second wires 422 and 424 from the stage 310. In the electrostatic chuck 304 in accordance with example embodiments, at least the portion of the substrate fixing unit generating an electrostatic force may overlap the dummy region II of the substrate W, and the substrate fixing unit may not overlap the panel formation region I of the substrate W.

Accordingly, a generated electric field to process the panel formation region I of the substrate W may not be distorted, and a generated spot may be reduced. In addition, a display quality manufactured by the electrostatic chuck 304 may be enhanced.

The electrostatic chuck 304 may include the first and second point fixing portions 330 and 332 spaced apart from one another such that affects to an electric field by the electrostatic force generated by the first and second point fixing portions 330 and 332 are minimized.

Figure 8:
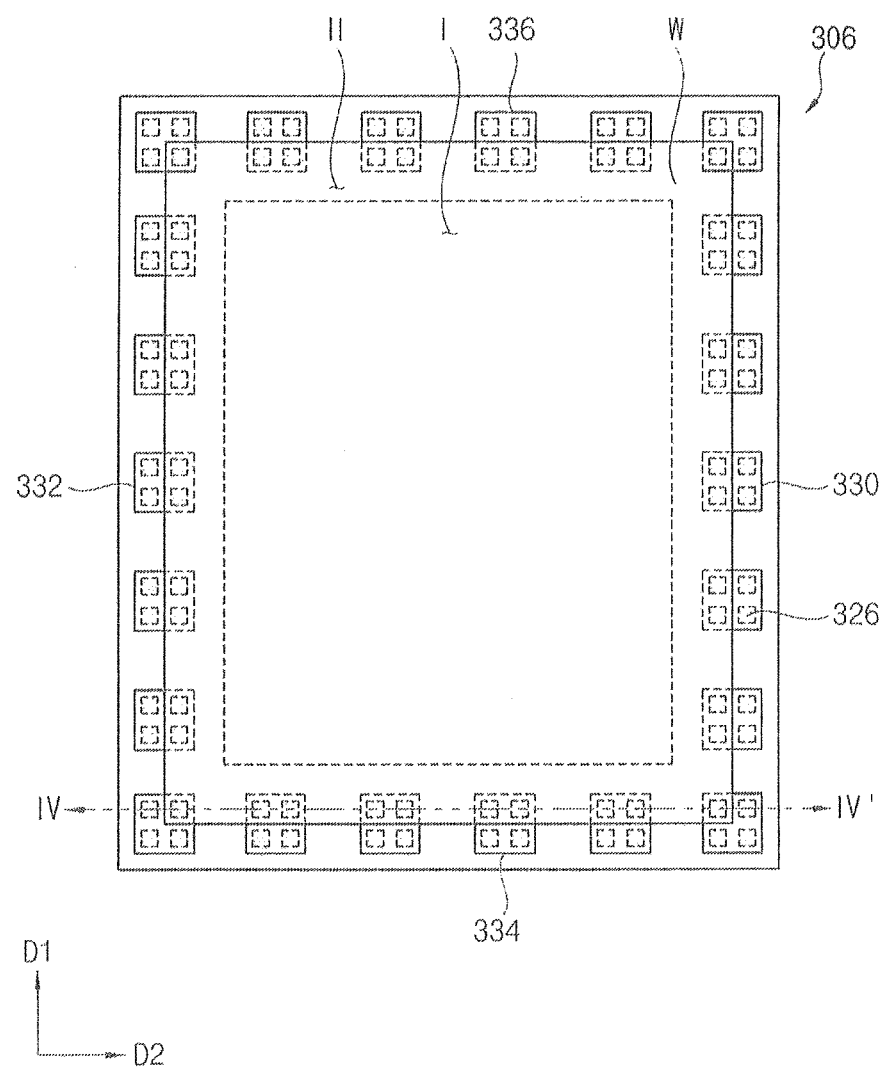
FIG. 8 is a plan view illustrating an electrostatic chuck according to example embodiments.
Figure 9:
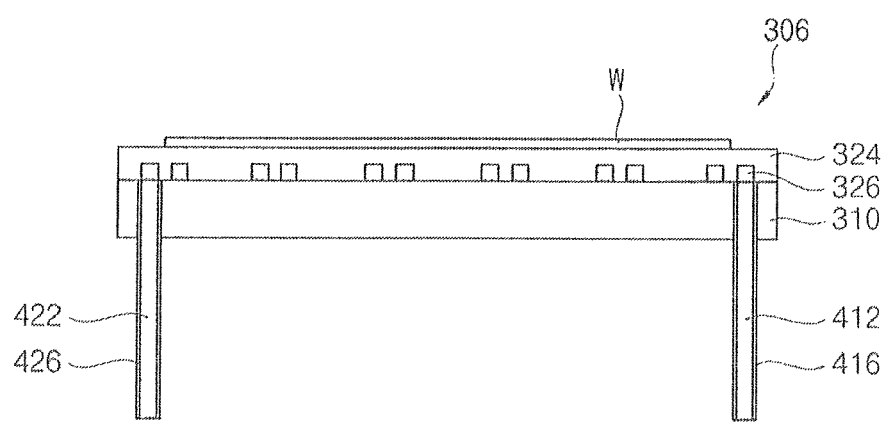
FIG. 9 is a cross-sectional view cut along the line IV-IV' of the FIG. 8.

FIG. 8 is a plan view illustrating an electrostatic chuck according to example embodiments. FIG. 9 is a cross-sectional view cut along the line IV-IV' of the FIG. 8. The electrostatic chuck of FIGS. 8 and 9 may be substantially the same as that of FIGS. 6 and 7, except for third and fourth point fixing portions. Thus like reference numerals refer to like elements, and repetitive explanations thereon may be omitted herein.

Referring to FIGS. 1, 8 and 9, the substrate processing apparatus includes a chamber 100, a substrate processing unit 200, an electrostatic chuck 306 and a power supply 400.

The electrostatic chuck 306 may include a stage 310 to support the substrate W and a substrate fixing unit including a plurality of electrode patterns 326.

The stage 310 may support the substrate W in a manufacturing process to the substrate W.

The substrate fixing unit may include the electrode patterns 326 insulated from the substrate W and spaced apart from one another on the stage 310. At least of the substrate fixing unit may overlap the dummy region II of the substrate W, and the substrate fixing unit may not overlap the panel formation region I of the substrate W.

Each of the electrode patterns 326 may be electrically connected to an anode or a cathode of the power supply 400.

Each of two electrode patterns 326 adjacent to each other may electrically connected to a respective one of the anode and the cathode of the power supply 400 such that an electrostatic force between the two electrode patterns 326 is generated to fix the substrate W to the stage 310.

In example embodiments, the substrate fixing unit further includes an insulation layer 324 which covers surfaces of the electrode patterns 326 and a top surface of the stage 310 and insulates the electrode patterns 326 from the substrate W.

The substrate fixing unit may further include a plurality of first point fixing portions 330, each of which fixes a right portion of the dummy region II of the substrate W to the stage 310 and a plurality of second point fixing portions 332 each of which fixes a left portion of the dummy region II of the substrate W to the stage 310.

Each of the first point fixing portions 330 may be arranged along a first direction D1 and may be spaced apart from one another. Each of the second point fixing portions 332 may be arranged along the first direction D1. The plurality of the first point fixing portions 330 and the plurality of the second point fixing portions 332 may be arranged along a second direction crossing the first direction D1.

In addition, the substrate fixing unit may further include a plurality of third point fixing portions 334, each of which fixes an upper portion of the dummy region II of the substrate W to the stage 310 and a plurality of fourth point fixing portions 336, each of which fixes a bottom portion of the dummy region II of the substrate W to the stage 310.

Each of the third point fixing portions 334 may be arranged along the second direction D2 and may be spaced apart from one another. Each of the fourth point fixing portions 336 may be arranged along the second direction D2. The plurality of the third point fixing portions 334 and the plurality of the fourth point fixing portions 336 may be arranged along the first direction D1.

Each of the first to fourth point fixing portions 330, 332, 334 and 336 may have a rectangular shape.

In example embodiments, the substrate fixing unit further includes a plurality of first wires 412 and a plurality of second wires 422 which connect the power supply 400 with the electrode patterns 326.

Each of an anode and a cathode of the first power supply 410 may be electrically connected to a respective one of the electrode patterns 326 through a respective one of the first wires 412, and each of an anode and a cathode of the second power supply 420 may be electrically connected to a respective one of the electrode patterns 326 through a respective one of the second wires 422.

A first insulation layer 416 may be provided to cover the first wires 412 and to insulate the first wires 412 from the stage 310. In addition, a second insulation layer 426 may be provided to cover the second wires 422 and to insulate the second wires 422 from the stage 310.

In the electrostatic chuck 306 in accordance with example embodiments, at least the portion of the substrate fixing unit generating an electrostatic force may overlap the dummy region II of the substrate W, and the substrate fixing unit may not overlap the panel formation region I of the substrate W.

Accordingly, a generated electric field to process the panel formation region I of the substrate W may not be distorted, and a generated spot may be reduced. In addition, a display quality manufactured by the electrostatic chuck 306 may be enhanced.

In particular, the electrostatic chuck 306 may further include the third and fourth point fixing portions 334 and 336 such that the substrate W is fixed to the stage 310 with a stronger adhesion force.

Figure 10:
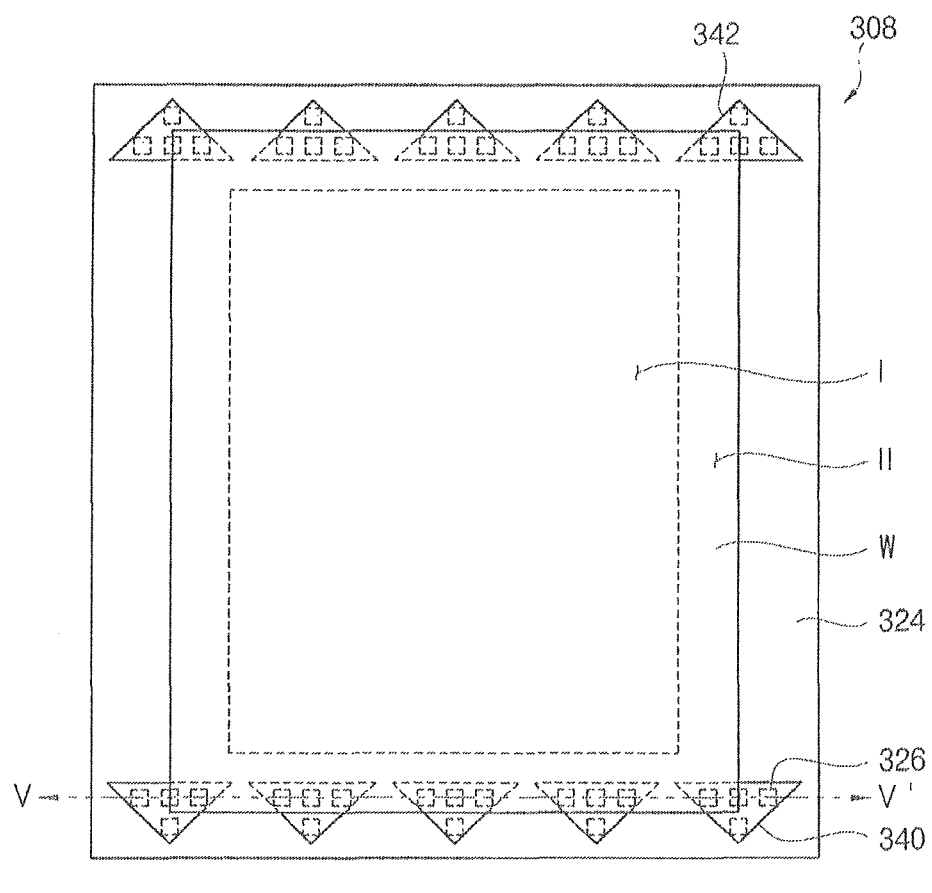
FIG. 10 is a plan view illustrating an electrostatic chuck according to example embodiments.
Figure 11:
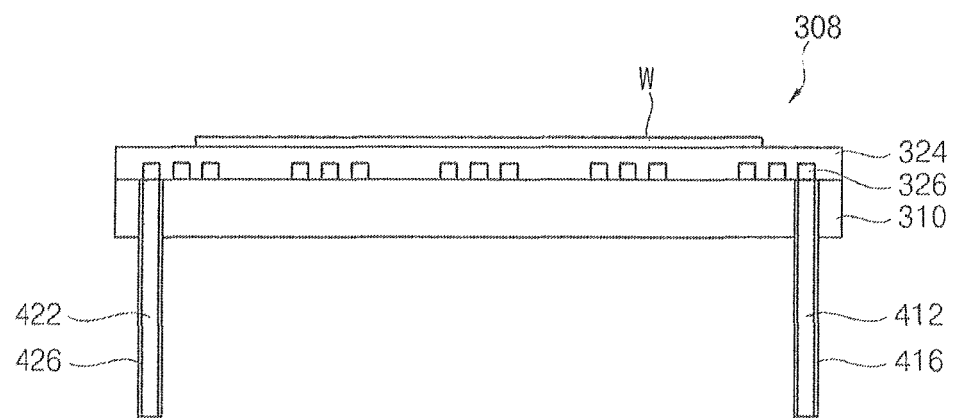
FIG. 11 is a cross-sectional view cut along the line V-V' of the FIG. 10.

FIG. 10 is a plan view illustrating an electrostatic chuck according to example embodiments. FIG. 11 is a cross-sectional view cut along the line V-V' of the FIG. 10. The electrostatic chuck of FIGS. 10 and 11 may be substantially the same as that of FIGS. 6 and 7, except for a shape of each of first and second fixing portions. Thus like reference numerals refer to like elements, and repetitive explanations thereon may be omitted herein.

Referring to FIGS. 1, 10 and 11, the substrate processing apparatus includes a chamber 100, a substrate processing unit 200, an electrostatic chuck 308 and a power supply 400.

The electrostatic chuck 308 may include a stage 310 to support the substrate W and a substrate fixing unit including a plurality of electrode patterns 326.

The stage 310 may support the substrate W in a manufacturing process to the substrate W.

The substrate fixing unit may include the electrode patterns 326 insulated from the substrate W and spaced apart from one another on the stage 310. At least of the substrate fixing unit may overlap the dummy region II of the substrate W, and the substrate fixing unit may not overlap the panel formation region I of the substrate W.

Each of the electrode patterns 326 may be electrically connected to an anode or a cathode of the power supply 400.

Each of two electrode patterns 326 adjacent to each other may electrically connected to a respective one of the anode and the cathode of the power supply 400 such that an electrostatic force between the two electrode patterns 326 is generated to fix the substrate W to the stage 310.

In example embodiments, the substrate fixing unit further includes an insulation layer 324 which covers surfaces of the electrode patterns 326 and a top surface of the stage 310 and insulates the electrode patterns 326 from the substrate W.

The substrate fixing unit may further include a plurality of first point fixing portions 340 each of which fixes a bottom portion of the dummy region II of the substrate W to the stage 310 and a plurality of second point fixing portions 342 each of which fixes an upper portion of the dummy region II of the substrate W to the stage 310.

Each of the first point fixing portions 340 may be arranged along a second direction D2 and may be spaced apart from one another. Each of the second point fixing portions 342 may be arranged along the second direction D2. The plurality of the first point fixing portions 340 and the plurality of the second point fixing portions 342 may be arranged along a first direction D1 crossing the second direction D2.

Each of the first and second point fixing portions 340 and 342 may have a triangular shape.

In example embodiments, the substrate fixing unit further includes a plurality of first wires 412 and a plurality of second wires 422 which connect the power supply 400 with the electrode patterns 326.

Each of an anode and a cathode of the first power supply 410 may be electrically connected to a respective one of the electrode patterns 326 through a respective one of the first wires 412, and each of an anode and a cathode of the second power supply 420 may be electrically connected to a respective one of the electrode patterns 326 through a respective one of the second wires 422.

A first insulation layer 416 may be provided to cover the first wires 412 and 414 and to insulate the first wires 412 from the stage 310. In addition, a second insulation layer 426 may be provided to cover the second wires 422 and to insulate the second wires 422 from the stage 310.

In the electrostatic chuck 308 in accordance with example embodiments, at least the portion of the substrate fixing unit generating an electrostatic force may overlap the dummy region II of the substrate W, and the substrate fixing unit may not overlap the panel formation region I of the substrate W.

Accordingly, a generated electric field to process the panel formation region I of the substrate W may not be distorted, and a generated spot may be reduced. In addition, a display quality manufactured by the electrostatic chuck 308 may be enhanced.

In particular, because each of the first and second point fixing portions 340 and 342 may have various shapes, an adhesion force between the stage 310 and the substrate W may increase.

Figure 12:
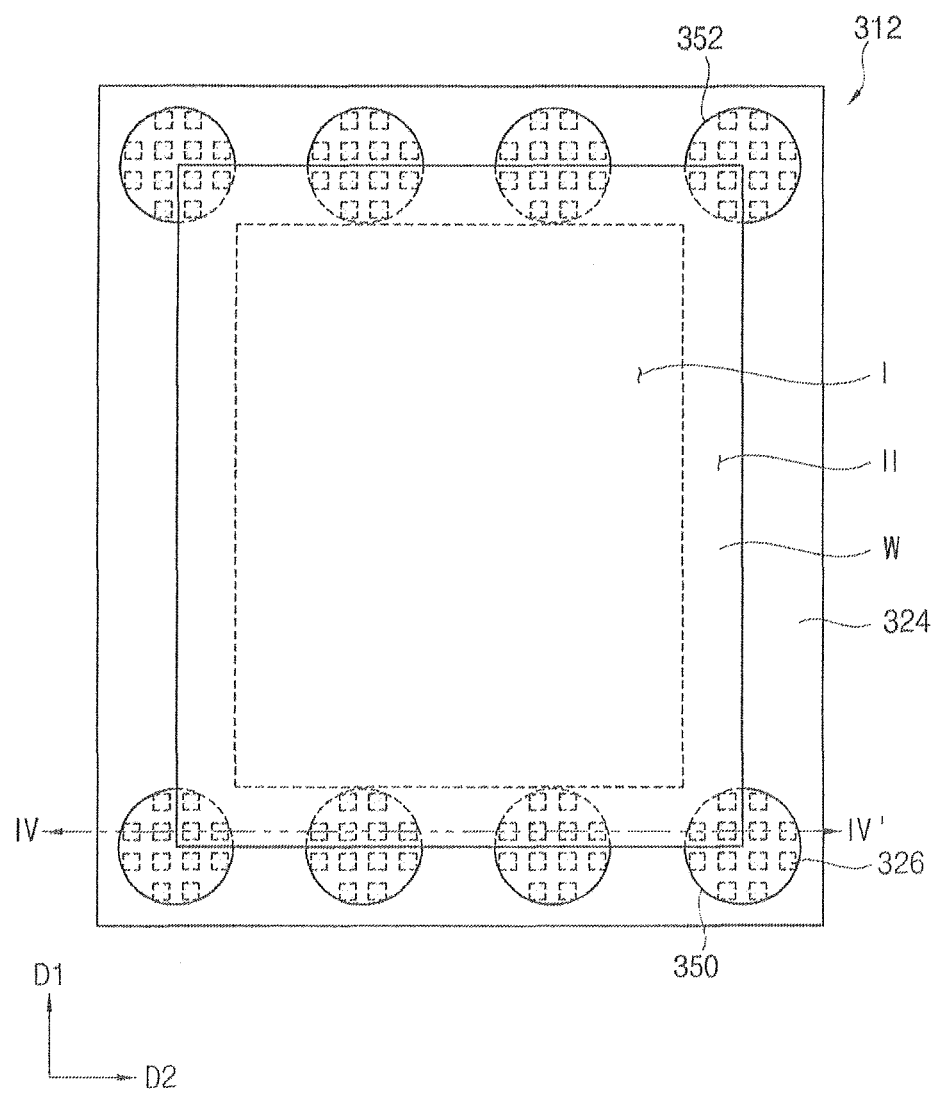
FIG. 12 is a plan view illustrating an electrostatic chuck according to example embodiments.
Figure 13:
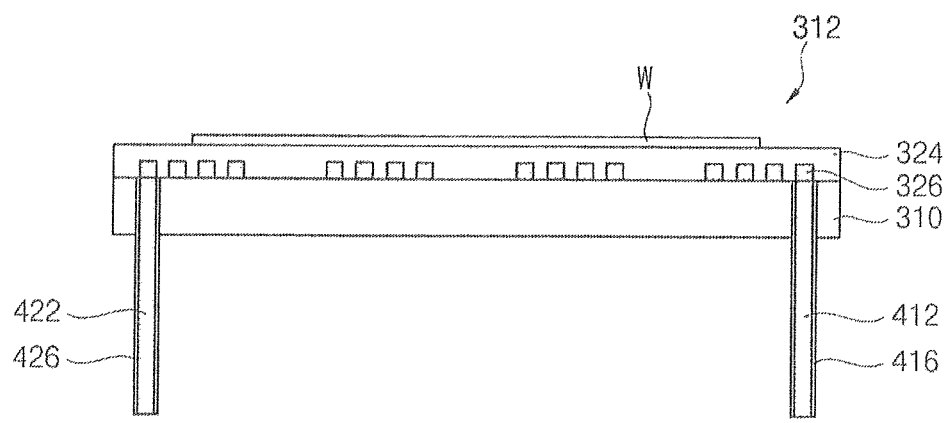
FIG. 13 is a cross-sectional view cut along the line VI-VI' of the FIG. 12.

FIG. 12 is a plan view illustrating an electrostatic chuck according to example embodiments. FIG. 13 is a cross-sectional view cut along the line VI-VI' of the FIG. 12. The electrostatic chuck of FIGS. 12 and 13 may be substantially the same as that of FIGS. 10 and 11, except for a shape of each of first and second fixing portions. Thus like reference numerals refer to like elements, and repetitive explanations thereon may be omitted herein.

Referring to FIGS. 1, 12 and 13, the substrate processing apparatus includes a chamber 100, a substrate processing unit 200, an electrostatic chuck 312 and a power supply 400.

The electrostatic chuck 312 may include a stage 310 to support the substrate W and a substrate fixing unit including a plurality of electrode patterns 326.

The stage 310 may support the substrate W in a manufacturing process to the substrate W.

The substrate fixing unit may include the electrode patterns 326 insulated from the substrate W and spaced apart from one another on the stage 310. At least of the substrate fixing unit may overlap the dummy region II of the substrate W, and the substrate fixing unit may not overlap the panel formation region I of the substrate W.

Each of the electrode patterns 326 may be electrically connected to an anode or a cathode of the power supply 400.

Each of two electrode patterns 326 adjacent to each other may electrically connected to a respective one of the anode and the cathode of the power supply 400 such that an electrostatic force between the two electrode patterns 326 is generated to fix the substrate W to the stage 310.

In example embodiments, the substrate fixing unit further includes an insulation layer 324 which covers surfaces of the electrode patterns 326 and a top surface of the stage 310 and insulates the electrode patterns 326 from the substrate W.

The substrate fixing unit may further include a plurality of first point fixing portions 350 each of which fixes a bottom portion of the dummy region II of the substrate W to the stage 310 and a plurality of second point fixing portions 352 each of which fixes an upper portion of the dummy region II of the substrate W to the stage 310.

Each of the first point fixing portions 350 may be arranged along a second direction D2 and may be spaced apart from one another. Each of the second point fixing portions 352 may be arranged along the second direction D2. The plurality of the first point fixing portions 350 and the plurality of the second point fixing portions 352 may be arranged along a first direction D1 crossing the second direction D2.

Each of the first and second point fixing portions 350 and 352 may have a triangular shape.

In example embodiments, the substrate fixing unit further includes a plurality of first wires 412 and a plurality of second wires 422 which connect the power supply 400 with the electrode patterns 326.

In the electrostatic chuck 312 in accordance with example embodiments, at least the portion of the substrate fixing unit generating an electrostatic force may overlap the dummy region II of the substrate W, and the substrate fixing unit may not overlap the panel formation region I of the substrate W.

Accordingly, a generated electric field to process the panel formation region I of the substrate W may not be distorted, and a generated spot may be reduced. In addition, a display quality manufactured by the electrostatic chuck 312 may be enhanced.

Because each of the first and second point fixing portions 350 and 352 may have various shapes, an adhesion force between the stage 310 and the substrate W may increase.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present inventive concept. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A substrate processing apparatus comprising:
an electrostatic chuck including a stage and a substrate fixing unit, the stage supporting a substrate having a panel formation region and a dummy region surrounding the panel formation region, the substrate fixing unit including a plurality of electrode patterns insulated from the substrate and spaced apart from one another, the substrate fixing unit at least partially overlapping the dummy region of the substrate and not overlapping the panel formation region;
a power supply electrically connected to the electrode patterns;
a substrate processing unit arranged on the electrostatic chuck, the substrate processing unit configured to process the panel formation region of the substrate; and
a chamber configured to receive the electrostatic chuck and the substrate processing unit.

2. The substrate processing apparatus of claim 1, wherein the substrate fixing unit further includes first and second fixing portions, each of which extends in a first direction, and wherein the first and second fixing portions are arranged along a second direction crossing the first direction.

3. The substrate processing apparatus of claim 2, wherein the substrate fixing unit further includes third and fourth fixing portions, each of which extents in the second direction, wherein the third and fourth fixing portions are arranged along the first direction, and wherein the third fixing portion connects a first end of the first fixing portion with a first end of the second fixing portion, and wherein the fourth fixing portion connects a second end of the first fixing portion with a second end of the second fixing portion.

4. The substrate processing apparatus of claim 1, wherein the substrate fixing unit includes a plurality of first point fixing portions and a plurality of second point fixing portions, wherein the first point fixing portions are arranged along a first direction and spaced apart from one another, and wherein the second point fixing portions are arranged along the first direction and spaced apart from one another, and wherein the first and second point fixing portions are arranged along a second direction crossing the first direction.

5. The substrate processing apparatus of claim 4, wherein the substrate fixing unit further includes a plurality of third point fixing portions and a plurality of fourth point fixing portions, wherein the third point fixing portions are arranged along the second direction and spaced apart from one another, and wherein the fourth point fixing portions are arranged along the second direction and spaced apart from one another, and wherein the third and fourth point fixing portions are arranged along the first direction.

6. The substrate processing apparatus of claim 4, wherein each of the first and second point fixing portions has a polygonal shape.

7. The substrate processing apparatus of claim 4, wherein each of the first and second point fixing portions has a circular shape or an elliptical shape.

8. The substrate processing apparatus of claim 1, wherein the electrostatic chuck further includes an insulation layer covering surfaces of the electrode patterns and a top surface of the stage, and wherein the insulation layer insulates the electrode patterns from the substrate.

9. The substrate processing apparatus of claim 1, wherein the width of a portion of the substrate fixing unit overlapping the dummy region of the substrate is in the range from about 1 mm to about 5 mm in a plan view.

10. The substrate processing apparatus of claim 1, wherein the area of a portion of the substrate fixing unit overlapping the dummy region of the substrate is in the range from 1% of an area of the substrate to 20% of the area of the substrate.

* * * * *